United States Patent
Li et al.

(10) Patent No.: US 7,617,599 B2
(45) Date of Patent: Nov. 17, 2009

(54) SENSOR PACKAGING METHOD FOR A HUMAN CONTACT INTERFACE

(75) Inventors: Zongya Li, Jiangsu (CN); Matthieu Lagouge, Jiangsu (CN); Hongyuan Yang, Wuxi (CN); Yanwei Chen, Jiangsu (CN)

(73) Assignee: Memsic, Inc., Andover, MA (US)

( * ) Notice: Subject to any disclaimer, the term of this patent is extended or adjusted under 35 U.S.C. 154(b) by 155 days.

(21) Appl. No.: 11/999,516

(22) Filed: Dec. 5, 2007

(65) Prior Publication Data

US 2009/0145237 A1    Jun. 11, 2009

(51) Int. Cl.
*H01R 43/00* (2006.01)
*G01L 7/00* (2006.01)

(52) U.S. Cl. .......................... 29/854; 29/841; 345/174; 73/756

(58) Field of Classification Search ............ 29/854, 29/841; 73/756, 715; 345/174
See application file for complete search history.

(56) References Cited

U.S. PATENT DOCUMENTS

| 6,401,545 | B1 | 6/2002 | Monk et al. |
| 7,148,882 | B2 | 12/2006 | Kamrath et al. |
| 2005/0236644 | A1* | 10/2005 | Getten et al. ............ 257/106 |
| 2007/0126130 | A1* | 6/2007 | Dehe et al. .............. 257/787 |

* cited by examiner

*Primary Examiner*—Derris H Banks
*Assistant Examiner*—Dan D Le
(74) *Attorney, Agent, or Firm*—Weingarten, Schurgin, Gagnebin & Lebovici LLP

(57) ABSTRACT

Methods of packaging systems pressure-sensitive devices that are subject to human contact force are disclosed. The methods include coupling and attaching the sensing devices and at least one other integrated circuit to a substrate; applying and curing a relatively-soft, protective material over the sensing portion of the sensing device; positioning a covering tool over the cured material; applying and curing a relatively-hard, protective coating around the covering tool and the relatively-soft, protective material; and applying a second, relatively-soft, protective material in the void left by the withdrawn covering tool.

12 Claims, 6 Drawing Sheets

SENSOR PACKAGING METHOD FOR A HUMAN CONTACT INTERFACE

CROSS REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention relates to a method of sensor packaging providing a human contact interface and, more particularly, to a flexible sensor packaging that protects embedded integrated circuitry and/or electronic devices from damage resulting from human contact force or pressure.

The measurement of a human contact force applied to a small area, which is to say, pressure, especially the pressure applied by the touch of a thumb or finger to a sensor that is sensitive to mechanical excitation, is of particular interest in applications in which small-size devices, such as cellular telephones, games, toys, and other consumer electronics controls, are desirable for converting the applied force into an electrical value.

For effective and reliable operation, a tactile pressure-sensing chip must satisfy two design requirements. First, the sensing chip must provide an efficient conversion of the applied pressure into some degree of mechanical excitation. Second, the sensing chip must protect the integrated circuitry and other embedded components from damage that may result from the induced mechanical stress. For example, membrane-type pressure-sensing chips that are embedded in conventional packaging have been fabricated and used for a long time. However, to avoid damage to the bonding pads and/or to the wire bonding that surround the chip's membrane, the protective material must be relatively hard. As a result, current pressure-sensing chips often require significant force from a human touch.

FIG. 1 shows conventional sensor packaging such as that disclosed in U.S. Pat. No. 6,401,545 to Monk, et al. According to the teachings of Monk, et al., a pressure sensor 1 is attached to a support 2 using an adhesive 3. The sensor 1 includes a pressure-sensitive membrane 4 and electrical contact pads 5, which are embedded in the pressure sensor 1 substrate. Bonded wires 6 electrically couple the sensor's electrical contact pads 5 to the support's bonding pads 7.

On an upper surface of the sensor 1, a dam 9 is fabricated around the periphery of the pressure-sensitive membrane 4. A first material 10, e.g., a gel, is deposited on top of the membrane 4, within the area confined by the dam 9. The mechanical properties of the first material 10 transfer pressure applied to the surface of the first material 10 to the membrane 4. The second material 11, e.g., a gel, is deposited outside of the limits of the dam 9, to cover and encapsulate the contact pads 5, the bonding pads 7, and the bonding wires 6, to protect them from the external environment, e.g., moisture, dust, temperature, light, and so forth.

Disadvantageously, the pressure-sensitive sensor 1 taught by Monk, et al. requires additional, specific fabrication steps at the sensor level, for example, to fabricate the dam 9, to embed the pressure-sensitive membrane 4 and electrical contact pads 5 in the substrate of the sensor 1, and to deposit the first and second materials 10 and 11, respectively, within and outside the limits of the dam 9.

FIG. 2 shows a force-type sensor using a capacitive-based pressure-sensing chip 13 of a type disclosed in U.S. Pat. No. 7,148,882 to Kamrath, et al. According to the teachings of Kamrath, et al. the capacitive-based pressure-sensing chip 13 is disposed on an upper surface of a substrate 12. Three discrete spacing layers 16, 17, and 18 surround the chip 13. A deformable membrane 14 is disposed on top of the upper spacing layer 17 and the plenum 19 created between the deformable membrane 14 and the upper surface of the substrate 12 is filled with a fluid.

Disadvantageously, the capacitive-based pressure-sensing chip 13 of Kamrath, et al. requires placement of three spacing layers 16, 17 and 18, complicating mass production fabrication. The Kamrath, et al. sensor 12 also does not provide protection to the capacitive-based pressure-sensing chip 13 except through the bending (flexural) resistance of the membrane 14.

Other embodiments of human contact-pressure sensor devices in the prior art include pressure-sensitive organic materials, which feature electrical sensitivity to an applied force. However, such organic materials are more expensive than silicon materials, which are a material of choice in MEMS and the integrated circuit industry.

However, in short, the prior art has failed to combine the advantages of a low fabrication cost, efficient conversion between external force load transfer to the sensor, and protection of the electrical circuitry and other embedded devices. Therefore, it would be desirable to provide a pressure-sensitive sensor that integrates a relatively soft material above the pressure-sensitive area, to effect a direct mechanical transfer from an externally-applied load to the pressure-sensitive area, with a relatively hard material, to protect the bonding wires, contact pads, bonding pads, and the like. Moreover, it would be desirable to provide silicon-based pressure sensors as well as any other standard or non-standard devices having small-force sensitive areas.

BRIEF SUMMARY OF THE INVENTION

The packaging process features a sensor device that includes a human contact interface that supports contact with the human body, e.g., a human finger or thumb, without damaging the sensing structure of the sensor device and a method of fabrication of the sensor device. The sensor device is composed of a pressure-sensitive chip fabricated based on Micro-Electro-Mechanical System (MEMS) technology and/or an application-specific integrated circuit (ASIC) chip, which have been assembled on or embedded in a printed circuit board (PCB) using standard Chip-on-Board technologies.

For example, a molding with an integrated spacer structure can be used to produce pressure-sensitive chips, microsensors, and/or microsensors in combination with other integrated circuits, such as ASIC chips, other MEMS, and so forth, that include both a softer material layer and a harder material layer. The softer material layer (or coating) is applied to protect the pressure-sensitive chip's top surface and the pressure-sensing portion of the chip from contamination by human body environment and to allow the finger force load to be transferred to the pressure-sensing portion of the sensor device. The harder material maintains the mechanical integrity of the sensor device and the wire bonding between chips.

In one application, the chips or dies to be embedded are first mechanically attached to a support or substrate and then wire-bonded. A first, softer material coating is deposited on the pressure-sensing portion. Then a molding tool is disposed on or over the first material coating so that when the harder material is deposited as the next step, the harder material does not cover the pressure-sensing portion. A final, second softer material coating is then deposited, which is in mechanical communication to the first softer material coating, to cover the device completely.

In another application, a molding tool is used to make a physical barrier above the pressure-sensing portion of the sensor device during the harder material deposition step. Once the hard material is cured, e.g., by heat treatment, the molding tool is removed leaving the sensor's pressure-sensing portion exposed to the external environment. Then the softer material can be deposited to fill the opening left by the molding tool, to make contact with the pressure-sensing portion.

In yet another application, in which the pressure-sensitive chip is attached to the PCB using flip-chip technology, the PCB includes a backside through-hole and is further structured and arranged so that the pressure-sensing portion of the sensor device is located above or in registration with the through-hole. A relatively-soft material can be applied through the backside through-hole of the PCB, to fill the cavity and to make contact with the chip's sensing area. A protective, relatively-hard material is applied from the front side of the PCB to protect the electrical circuitry from external environment.

BRIEF DESCRIPTION OF THE SEVERAL VIEWS OF THE DRAWINGS

The invention will be more fully understood by reference to the following Detailed Description of the invention in conjunction with the Drawing, of which.

DETAILED DESCRIPTION OF THE INVENTION

Figure 1:
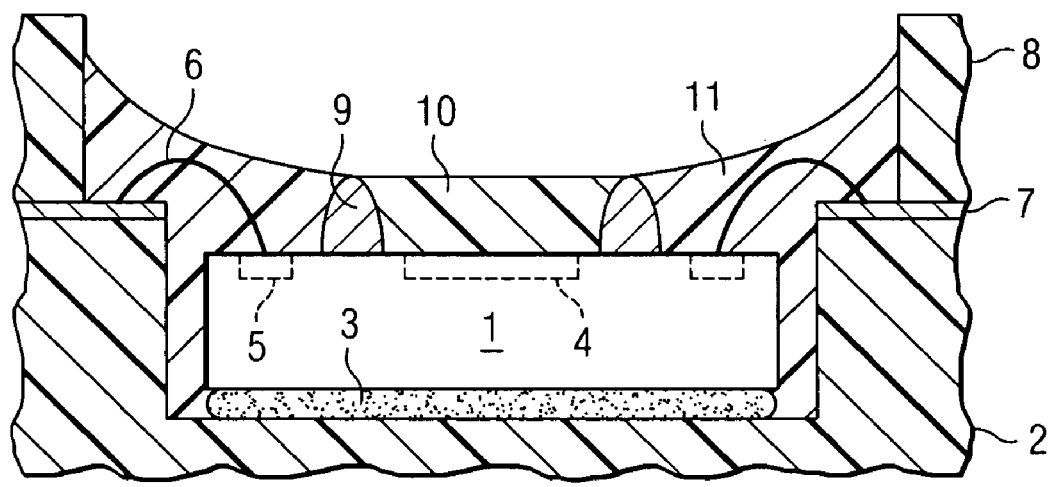
FIG. 1 shows a cross-sectional elevation view of a pressure-sensitive chip according to the prior art.
Figure 2:
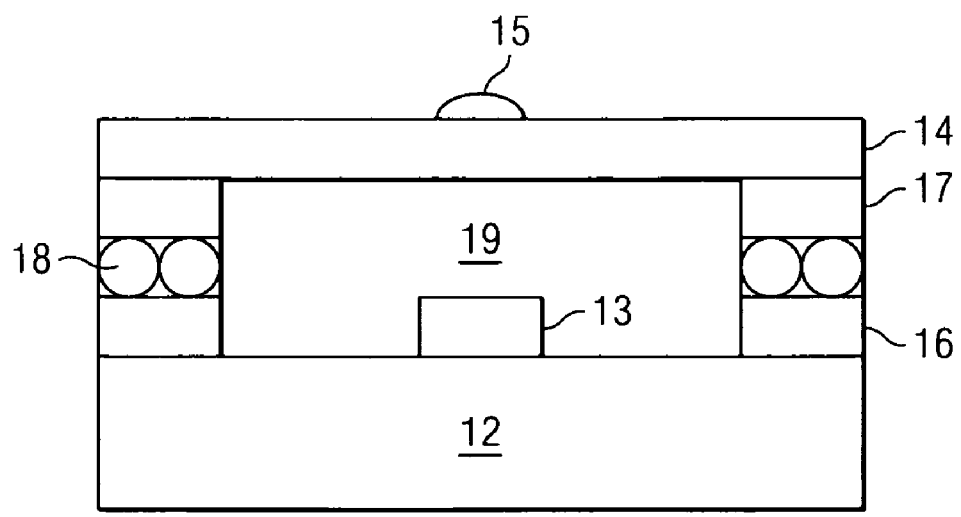
FIG. 2 shows a cross-sectional elevation view of a capacitative-type pressure-sensitive chip according to the prior art.
Figure 3:
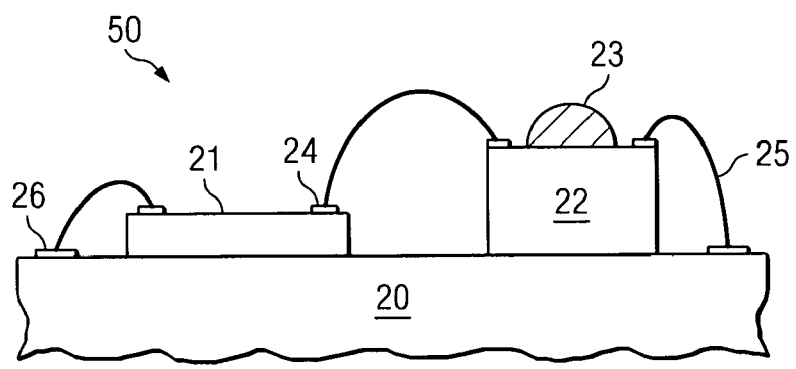
FIG. 3 shows a cross-sectional elevation view of a pressure-sensitive device in accordance with the present invention.

Methods of fabricating a pressure-sensitive device and for fabricating a human contact interface for use in conjunction with the pressure-sensitive device and the pressure-sensitive device resulting from the fabrication process are disclosed. FIG. 3 shows a cross-sectional view of a pressure-sensitive sensing device 50, i.e., chip. The pressure-sensitive chip 50 includes a pressure-sensitive device 22, which is sensitive to applied mechanical forces, and at least one other integrated circuit or other device 21, such as an application-specific integrated circuit (ASIC), which are structured and arranged on the upper surface of a common substrate 20, e.g. a printed circuit board ("PCB"). The pressure-sensitive device 22 and each of other integrated circuits or other devices 21 include electrical contact pads 24, which are electrically coupled, e.g., wire-bonded, to respective electrical contact pads 26 on the substrate 20 using standard bonding wires 25.

In a first step of the method, a small amount, e.g., a drop or dot, of a relatively-soft material 23 is deposited on the upper surface of the pressure-sensitive device 22. More specifically, the drop of relatively-soft material 23 is deposited over, so as to completely cover, the sensing portion, e.g., the pressure sensor (not shown), of the pressure-sensitive device 22. The relatively-soft material is then allowed to cure.

The relatively-soft material 23 used to cover the pressure sensor can be selected according to final application requirements, such as the operational environment, high and/or low operating temperatures, dust, water, humidity, and/or moisture repelling capabilities, and the like. Soft polymers, such as Dow Corning 3-4154 manufactured by Dow Corning of Midland, Mich., and silicone, such as WR 704 manufactured by Nanjing Well Chemical Co, Ltd., can be used as the relatively-soft material 23.

Figure 4:
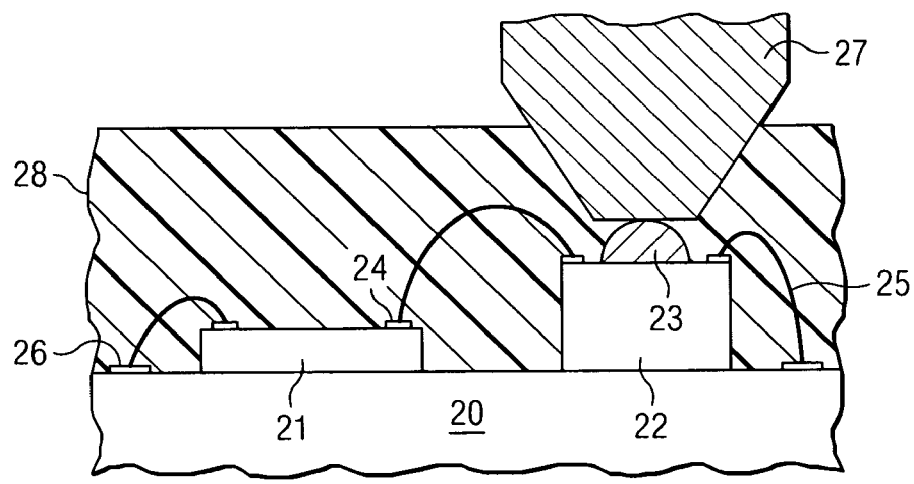
FIG. 4 shows a cross-sectional elevation view of a pressure-sensitive device and covering tool in accordance with the present invention.

In second and third steps, referring to FIG. 4, a covering tool 27, e.g., a tool with a frustoconical shape, is disposed on top of the dot of relatively-soft material 23, over the pressure-sensitive device 22, before a relatively-hard material 28 is deposited around the covering tool 27, on the substrate 20, over the pressure-sensitive device 22, the at least one integrated circuit or other device 21, and the bonding wires 25. The whole is then allowed to cure.

The relatively-hard material 28 can be any material having properties suitable for protection of integrated devices and circuitry and offering protection against dust, shock, moisture, humidity, and vibration over a wide range of temperatures. Hard polymers, such as Dow Corning 3-4207, and an epoxy, such as ACE LE-3834, can be used as the relatively-hard material 28.

"Curing" can take on many forms. Indeed, the curing times and curing temperatures will depend on the materials 22 and 28 selected. For example, the inventors have used WR 704 for the relatively-soft material 22, which cures at room temperature after about 24 hours and a hard epoxy that cures at about 150 degrees Centigrade (° C.), or about 300 degrees Fahrenheit (° F.) fro about 30 minutes.

Those of ordinary skill in the art can appreciate that a myriad of specially-designed molds (not shown) can be used that include a covering tool 27 that can be structured and arranged to be in registration with the dot of relatively-soft material 23. Such molds can also provide a fluid path(s) (not shown) through which the relatively-hard material 28 can be deposited on the substrate 20, the at least one integrated circuit or other device 21, and the bonding wires 25. Optionally, the covering tool 27 can be adapted to include a cannula so that, after the covering tool 27 contacts the dot of relatively-soft material 23 and is properly positioned, the relatively-hard material 28 can be extruded through an opening in the covering tool 27 associated with the cannula.

Figure 5:
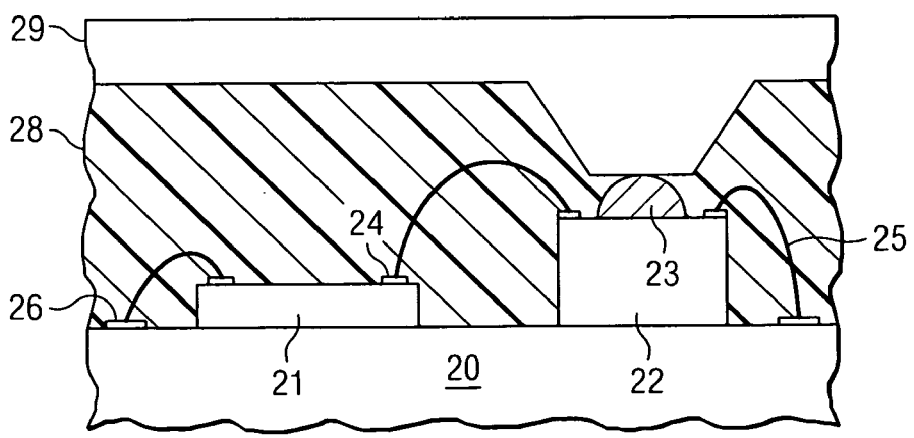
FIG. 5 shows a cross-sectional elevation view of a finished pressure-sensitive device in accordance with the present invention.

In a fourth step, referring to FIG. 5, after the whole has cured, the mold and the covering tool 27 can be removed and a final coating 29 can be deposited to fill the void in the mold left by the withdrawn covering tool 27. The final coating 29 can be made using the same material as that used for the relatively-soft material 23 or another material. Selection of the material for the final coating 29 depends on specific need for the application, e.g., cost, compatibility, adherence properties, relative color, chemical resistance, and the like. The shape of the final coating 29, especially in the void area previously occupied by the covering tool 27 combined with the material hardness difference between coating 29 and relatively-hard material 28 ensure good load transfer from external, mechanical contact pressure to the sensing portion of the pressure-sensitive device 22.

For other, specific applications, such as for use as humidity sensors, light sensors, gas sensors, and other sensors that require exposure to the ambient environment, a final coating 29 is not included so that the dot of relatively-soft material 23 and/or the respective sensing portion of the sensing device 22 is in direct contact with or exposed to the ambient environment. In such applications, the relatively-hard material 28 still protects the substrate 20, the at least one integrated circuit or other device 21, and the bonding wires 25 from the ambient environment, while exposing the sensing portion of the pressure-sensitive device 22 to the media to be measured or detected.

Figure 6:
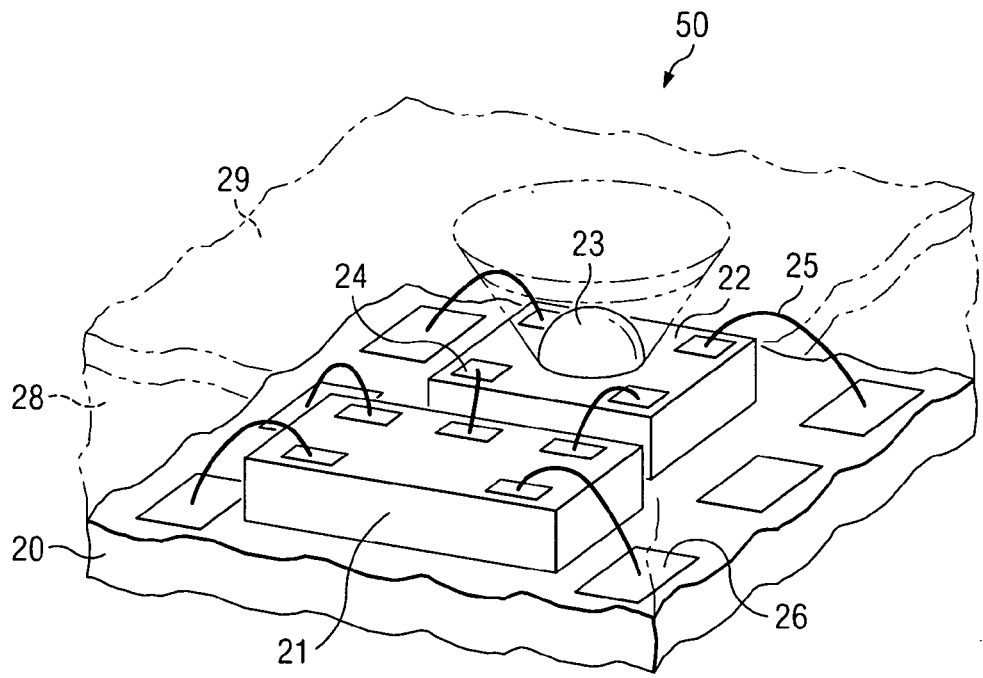
FIG. 6 shows an isometric view of a finished pressure-sensitive device in accordance with the present invention.

FIG. 6 shows an isometric view of the sensor packaging 50. Those skilled in the art can appreciate that, according to different needs and applications, additional integrated circuits or devices can be integrated into the same packaging 50 and, moreover, that multiple accesses to the ambient environment can be provided in the same way as with the pressure-sensitive device 22. For example, one such system can include a pressure sensor, a humidity sensor, a gas sensor, and an associated electrical circuit to control the signal processing. For this system, each of the gas, pressure, and humidity sensors requires exposure of their sensor areas to the ambient environment while the electrical circuits, the electrical contact pads, and the associated bonding wires are protected.

Figure 7:
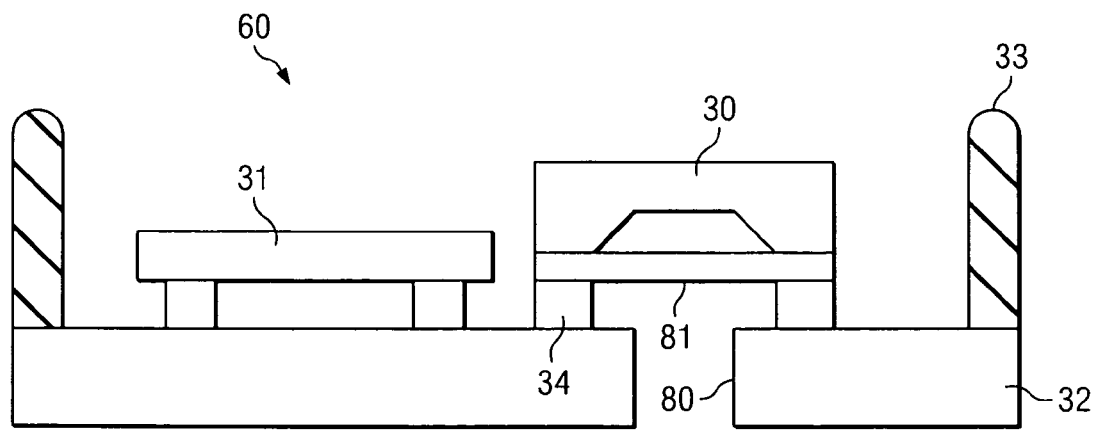
FIG. 7 shows a cross-sectional elevation view of a pressure-sensitive device attached to a PCB by flip-chip technology in accordance with the present invention.

Having described an application of the present invention to a pressure-sensitive device 50 using bonding wires, a sensing device 60 manufactured using flip-chip technology for attaching dies to the substrate or PCB will now be described. Referring to FIG. 7, in a first step, a pressure-sensitive sensing device 30 and at least one other integrated circuit or other device 31 are attached to one surface of a substrate 32, such as a PCB, by flip-chip means using electrical connections 34.

Subsequently, in a next step, a dam 33 can be fabricated on the one surface of the substrate 32, to delimit the completed device area. Those of ordinary skill in the art can appreciate that the dam 33 is optional, and can be avoided by using a mold as previously described. Reciprocally, a dam can optionally be used to delimit the final size of the previously described system 50. Additionally, although the pressure-sensitive sensing device 31 is described as being mounted using a flip-chip procedure, it can also be mounted using a standard wire-bonding without altering the properties of the final device.

A through-hole 80 is provided through the substrate 32. The through-hole 80 is arranged so as to be facing the pressure-sensing portion 81 of the pressure-sensitive device 30, to provide access between the pressure-sensing portion 81 of the pressure-sensitive device 30 and the ambient environment.

Figure 8:
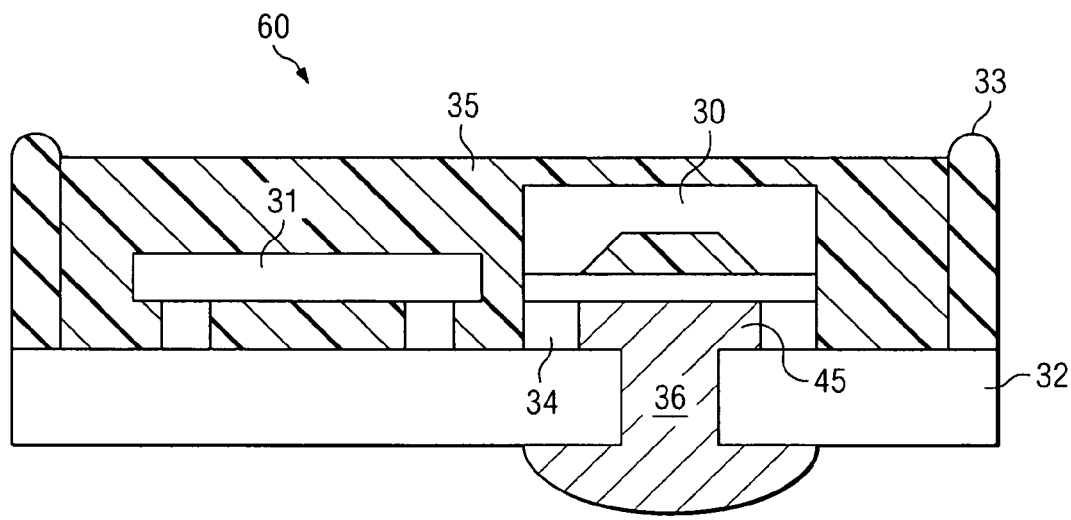
FIG. 8 shows a cross-sectional elevation view of the pressure-sensitive device of FIG. 7 with the electronics on one side of the PCB and the human contact interface on the opposite side of the PCB in accordance with the present invention.

Referring to FIG. 8, in a next step, the void delimited by the dam 33 on the one surface of the substrate 32 is filled using a relatively-hard material 35 to protect the pressure-sensitive sensing device 31 and other integrated circuits or other devices 31. The system 60 can then be cured. Then, a second, relatively-soft material 36 can be injected or extruded into or through the through-hole 80, to provide a human-contact interface between the opposite surface of the substrate 32 and the pressure-sensing portion 81 of the pressure-sensitive device 30. The relatively-soft material 36 can then be cured. It is to be noted that the choice of materials 35 and 36 for the flip-chip embodiment 60 can be the same or virtually the same as those for the bonded-wire embodiment.

Depending on, for example, the viscosity, melting point, and so forth of the materials 35 and 36 and the curing procedure, e.g., time, temperature, and so forth, the order in which the materials 35 or 36 are deposited and cured can be reversed or otherwise modified, to ensure an optimal covering of the sensing portion 81 of the pressure-sensitive device 30 as well as properly under-filling the void space 45 between the sensing portion 81 of the pressure-sensitive device 30 and the substrate 32.

Figure 9:
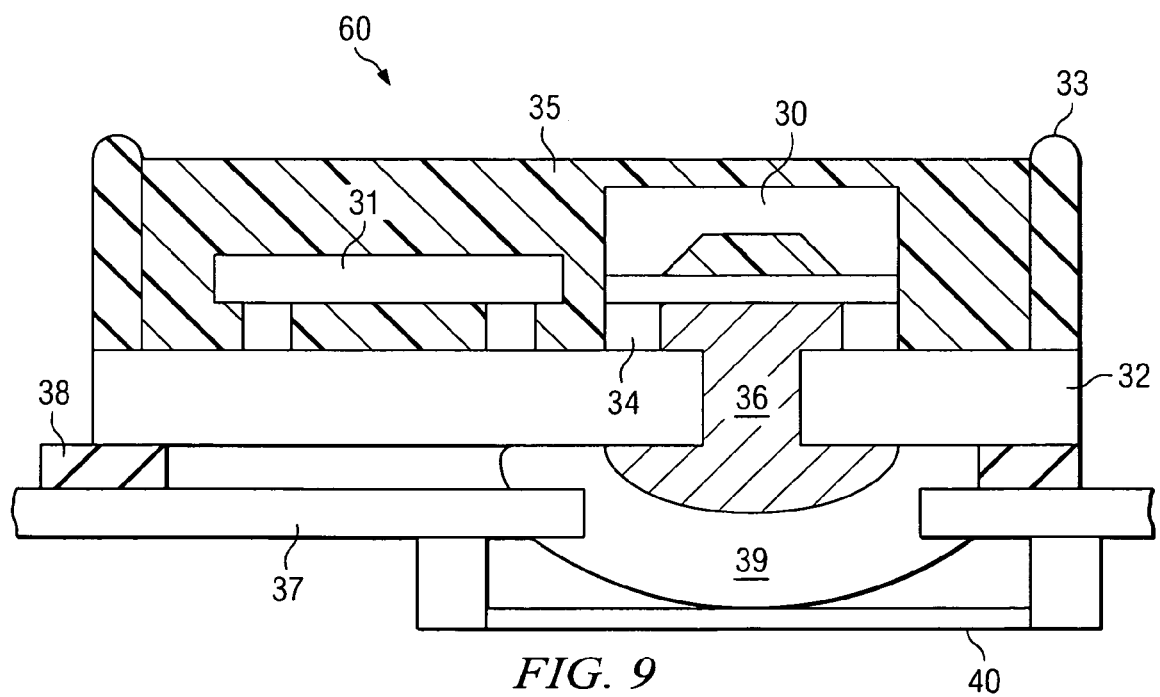
FIG. 9 shows a cross-sectional elevation view of a pressure-sensitive device of FIG. 8 with an optional relatively-hard human contact interface in accordance with the present invention.

Optionally, referring to FIG. 9, the flip-chip embodiment 60 can be fixedly attached, e.g., soldered, to a PCB 37 or other substrate, e.g., using electrical connections 38, and a second, relatively-soft coating 39 can be added over the first, relatively-soft material 36 on the backside of the device 60 through an opening in the PCB 37. The second, relatively-soft material 39 used can be the same as the first, relatively-soft material 36 or a different material, depending on the final application requirements.

A relatively-hard component 40 can optionally be disposed on the PCB 37, over the relatively-soft material 39 to serve as final human contact interface. The optional, relatively-hard component 40 provides a better human contact interface depending on the requirements of the final application or is simply provided for aesthetic reasons. It is also to be noted that in some application, one can use a different shaped component to replace both the relatively-soft material 39 and the relatively-hard component 40 to make a direct human contact interface.

The advantage of the flip-chip embodiment 60 is disposing the human contact interface on the back side of the PCB 32 and disposing the components on the front side of the PCB 32. Depending on the geometry of the second, relatively-soft material 39 and/or the shape of a relatively-hard component 40, this front-back arrangement provides a relatively-large human contact interface in combination with a high integration density of devices.

Figure 10:
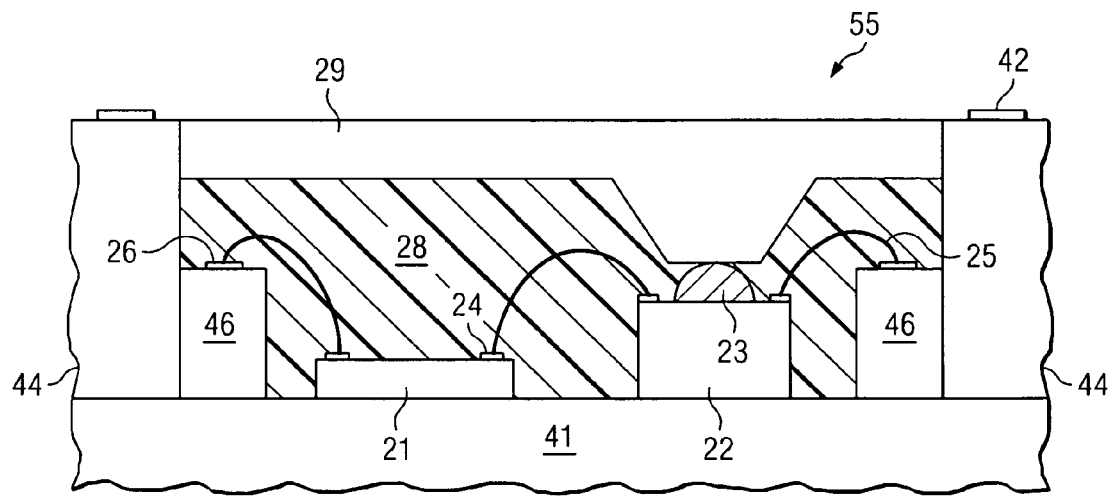
FIG. 10 shows a cross-sectional elevation view of a pressure-sensitive device having peripheral sidewalls in accordance with the present invention.

Referring to FIG. 10, another illustrative bonded-wire packaging system 55 is shown. The system 55 includes a substrate 41 having peripheral sidewalls 44 to form a natural cavity. The system 55 further includes internal, electrical interconnections between the inner cavity electrical pads 26 disposed, for example, on inner side wall 46 and external electrical connections 42 disposed, for example, on the tops of the peripheral sidewalls 44.

Manufacture of this system 55 would be identical to that previously described in connection with the system 50 shown in FIGS. 3-5. Advantageously, the peripheral sidewalls 44 satisfy the need for a mold and, moreover, the final packaging system 55 features electrical connections 42 and human contact interface 29 on the same side.

Those of ordinary skill in the art can appreciate that, although the relatively-soft material 29 shown in FIG. 10 reaches the top of, i.e., the same elevation, as the upper surface of the peripheral sidewalls 44, depending on the final application and the material properties of the relatively-soft material 29, the contact interface 29 can be formed above the elevation of the electrical connections 42, or, alternatively, below the elevation of the electrical connections 42.

Figure 11:
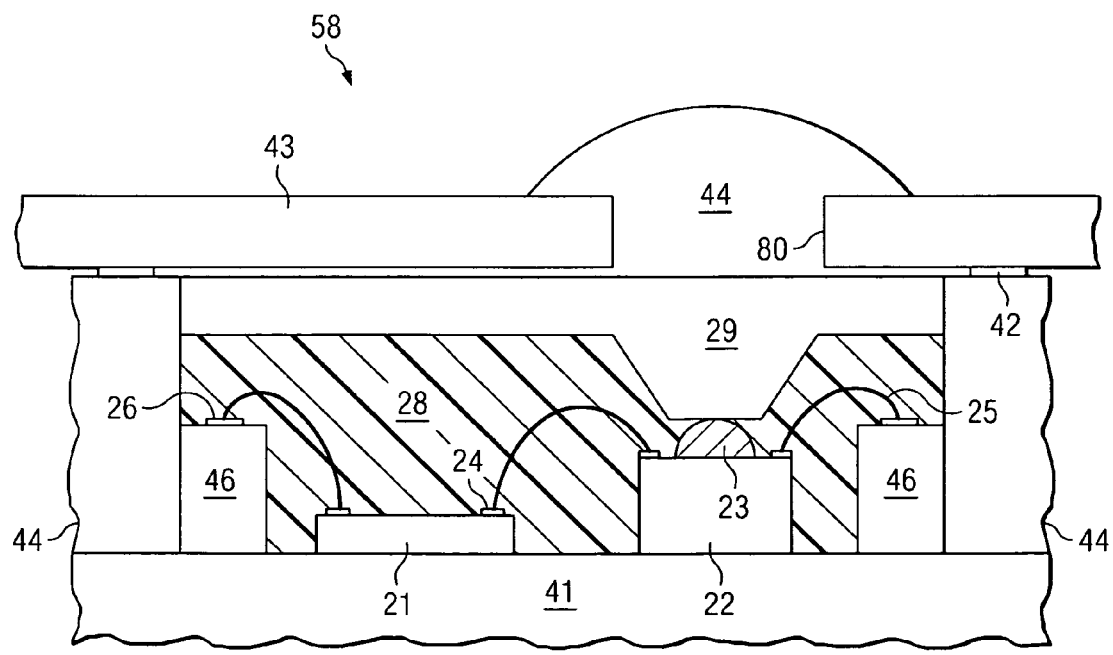
FIG. 11 shows the cross-sectional elevation view of FIG. 10 that is optionally attached to a PCB in accordance with the present invention.

Referring to FIG. 11, yet another illustrative bonded-wire packaging system 58 will be described. The system 58 shown in FIG. 11 fixedly attaches the bonded-wire packaging system 55 of FIG. 10 onto a PCB 43, using the external electrical connections 42. As a result, with this arrangement the pressure-sensitive device 22 and other integrated circuit and/or other devices 21 are disposed on one side of the PCB 43 and the human contact interface 44 is disposed on the other side. Thus, the structure of the PCB 43 provides additional protection for the pressure-sensitive device 22 and any other devices 21.

As previously described in connection with FIG. 9, with the system 58, the PCB 43 includes a through-hole 80 proximate to and facing the sensitive area of the pressure-sensitive device 22 and the dot 23. A relatively-soft material 44 can be deposited through the through-hole 80 onto the final coating 29.

Figure 12:
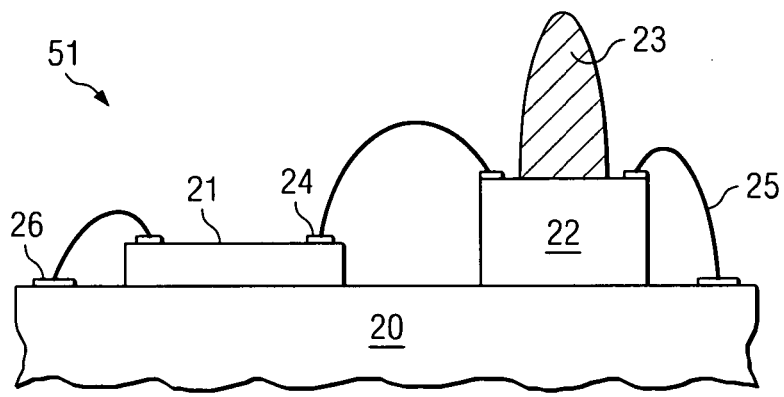
FIG. 12 shows a cross-sectional elevation view of a pressure-sensitive device with a large dot in accordance with the present invention.

Referring to FIG. 12, still another illustrative bonded-wire packaging system 51 will be described. The system 51 shown in FIG. 12 and the method of manufacturing the same is identical or substantially identical to the system 50 shown in FIG. 3, except that the dot 23 of relatively-soft material in system 51 is much larger than that shown in system 50. The larger dot 23 negates the need for a covering tool.

Figure 13:
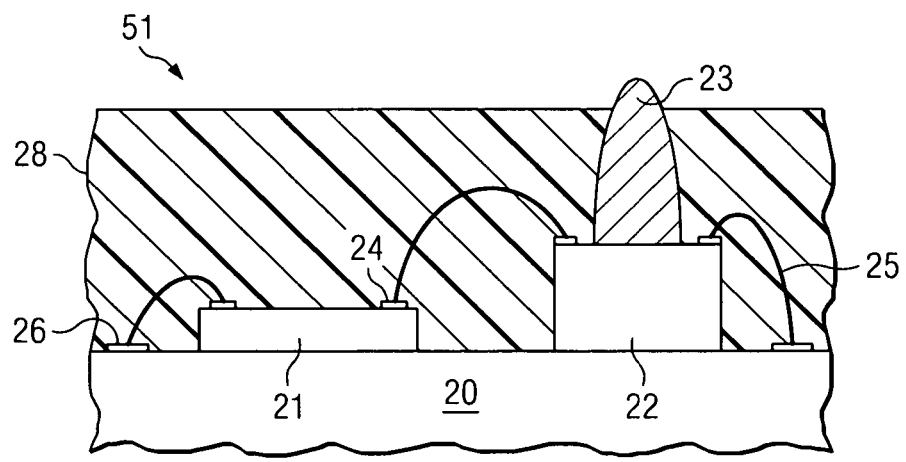
FIG. 13 shows the cross-sectional elevation view of the pressure-sensitive device of FIG. 12 with the tip of the large dot extending through the relatively-hard material in accordance with the present invention.
Figure 14:
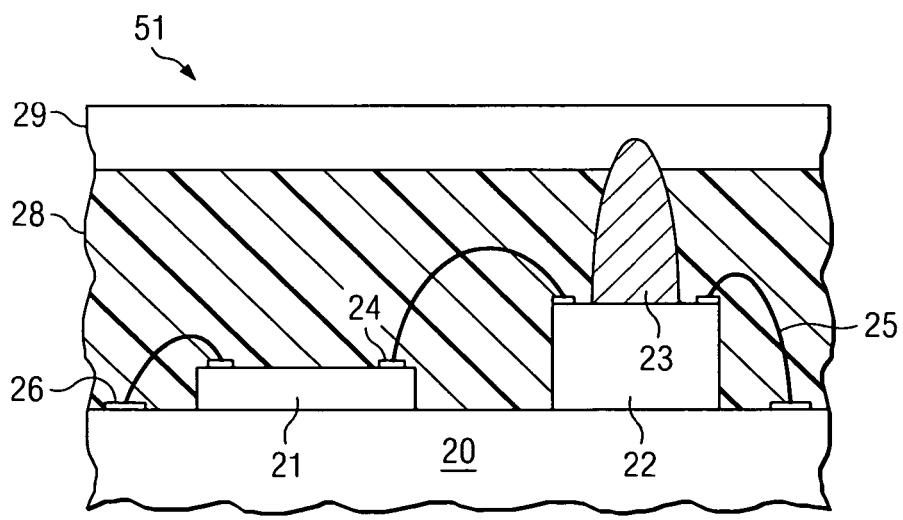
FIG. 14 shows the cross-sectional elevation view of the pressure-sensitive device of FIG. 13 with the tip of the large dot covered by the second, relatively-soft coating in accordance with the present invention.

Indeed, as shown in FIG. 13, the relatively-hard material 28 is applied over the substrate 20, around the dot 23, while the tip is left to extend beyond the upper surface of the relatively-hard material 28. Then, in a next step, as shown in FIG. 14, the second, relatively-soft coating 29 is applied over the relatively-hard material 28 and the tip of the dot 23.

It will be apparent to those skilled in the art that modifications to and variations of the disclosed methods and apparatus are possible without departing from the inventive concepts disclosed herein, and therefore the invention should not be viewed as limited except to the full scope and spirit of the appended claims.

What is claimed is:

1. A method of packaging a pressure-sensitive device subject to a human contact force, the method comprising:
    electrically coupling and mechanically attaching the pressure-sensitive device having a sensing portion and at least one other integrated circuit or electrical device to a first surface of a substrate;
    applying a relatively-soft, protective, adhesive coating over the sensing portion of the pressure-sensitive device;
    curing the relatively-soft, protective, adhesive coating;
    positioning a covering tool over the relatively-soft, protective, adhesive coating and over the pressure-sensitive device;
    applying a relatively-hard, protective coating over the pressure-sensitive device, the at least one other integrated circuit or electrical device, and the substrate;
    curing the relatively-hard, protective coating; and
    withdrawing the covering tool to provide a void that exposes the relatively-soft, protective, adhesive coating to an ambient environment; and
    applying a second, relatively-soft, material in the void left by the withdrawn covering tool.

2. The method as recited in claim 1, wherein the pressure sensitive device is attached by bonded wires or using flip-chip technology.

3. The method as recited in claim 1, wherein the covering tool positioned over the relatively-soft, protective, adhesive coating and over the pressure-sensitive device has a frusto-conical shape.

4. The method as recited in claim 1, wherein the covering tool includes a cannula through which the relatively-hard, protective coating is applied over the pressure-sensitive device, the at least one other electrical device, and the substrate.

5. The method as recited in claim 1, wherein applying the relatively-soft, protective, adhesive coating over the sensing portion of the pressure-sensitive device provides a relatively large dot that extends through the relatively-hard, protective coating after the same is applied over the pressure-sensitive device, the at least one other integrated circuit or electrical device, and the substrate.

6. The method as recited in claim 1, wherein the substrate includes peripheral sidewalls defining a cavity with the first surface of said substrate and the pressure-sensitive device and the at least one other integrated circuit or electrical device are applied to said first surface within the cavity.

7. The method as recited in claim 6, the method further comprising:
    including internal electrical connections between the cavity and the peripheral sidewalls.

8. The method as recited in claim 6, the method further comprising:
    electrically coupling the substrate and peripheral sidewalls to a printed circuit board having a through-hole so that the sensing portion of the pressure-sensitive device is in registration with the through-hole in the printed circuit board; and
    applying another relatively-soft, protective, adhesive coating through said through-hole and over the sensing portion of the pressure-sensitive device.

9. The method as recited in claim 1, wherein a mold is used when positioning the covering tool and applying the relatively-hard, protective coating over the pressure-sensitive device, the at least one integrated circuit or other electrical device, and the substrate.

10. A packaging system manufactured in accordance with claim 1.

11. A packaging system manufactured in accordance with claim 6.

12. A packaging system manufactured in accordance with claim 8.

* * * * *

UNITED STATES PATENT AND TRADEMARK OFFICE
CERTIFICATE OF CORRECTION

PATENT NO. : 7,617,599 B2 Page 1 of 1
APPLICATION NO. : 11/999516
DATED : November 17, 2009
INVENTOR(S) : Zongya Li et al.

It is certified that error appears in the above-identified patent and that said Letters Patent is hereby corrected as shown below:

On the Title Page, Item (75) Inventors, reads as follows:

"Zongya Li, Jiangsu (CN); Matthieu Lagouge, Jiangsu (CN); Hongyuan Yang, Wuxi (CN); Yanwei Chen, Jiangsu (CN)"

Should read as follows:

-- Zongya Li, Wuxi, Jiangsu (CN); Matthieu Lagouge, Wuxi, Jiangsu (CN); Hongyuan Yang, Wuxi, Jiangsu Province (CN); Yanwei Chen, Wuxi, Jiangsu (CN) --

Signed and Sealed this

Sixth Day of April, 2010

David J. Kappos
*Director of the United States Patent and Trademark Office*